United States Patent
Yoon et al.

(10) Patent No.: US 9,166,162 B2
(45) Date of Patent: Oct. 20, 2015

(54) RESISTIVE MEMORY DEVICE

(75) Inventors: Sung-Joon Yoon, Gyeonggi-do (KR); Hyung-Dong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 13/595,324

(22) Filed: Aug. 27, 2012

(65) Prior Publication Data
US 2013/0299770 A1 Nov. 14, 2013

(30) Foreign Application Priority Data

May 11, 2012 (KR) .................. 10-2012-0050242

(51) Int. Cl.
*H01L 29/02* (2006.01)
*H01L 45/00* (2006.01)
*H01L 27/24* (2006.01)

(52) U.S. Cl.
CPC .............. *H01L 45/146* (2013.01); *H01L 45/08* (2013.01); *H01L 45/1233* (2013.01); *H01L 27/2481* (2013.01)

(58) Field of Classification Search
CPC .................................................. H01L 45/1608
USPC .................. 257/1–5, 421, E45.001, E21.003; 365/163, 148, 157; 438/237, 202, 241, 438/381
See application file for complete search history.

(56) References Cited

U.S. PATENT DOCUMENTS

2006/0087921 A1* 4/2006 Iwasaki ....................... 369/13.01
2010/0073997 A1* 3/2010 Elmegreen et al. ........... 365/157
2011/0161605 A1* 6/2011 Lee et al. ....................... 711/154
2012/0147666 A1* 6/2012 Dubourdieu et al. ......... 365/163
2013/0062714 A1   3/2013 Zhu et al.

FOREIGN PATENT DOCUMENTS

KR       1020070069160       7/2007

OTHER PUBLICATIONS

P. Madakson et al., "Stresses and radiation damage in Ar+ and Ti+ ion-implanted silicon," J. Appl. Phys., Sep. 1, 1987, pp. 1688-1693, vol. 62, No. 5.
T. Ghani et al., "A 90nm High Volume Manufacturing Logic Technology Featuring Novel 45nm Gate Length Strained Silicon CMOS Transistors," IEDM, 2003, pp. 978-980.
Tyagi, S., et al., An advanced low power, high performance, strained channel 65nm technology, 2005 Electron Devices Meeting, IEDM Technical Digest, IEEE International, 2005.
Mistry, K., et al., Delaying forever: Uniaxial strained silicon transistors in a 90nm CMOS technology, 2004 Symposium on VLSI Technology Digest of Technical Papers, 2004, pp. 50-51.
Wang, D., et al., Magnetostriction effect of amorphous CoFeB thin films and application in spin-dependent tunnel junctions, Journal of Applied Physics, 2005, pp. 10C906-1-100906-3, vol. 97.

* cited by examiner

*Primary Examiner* — Mark A Laurenzi
(74) *Attorney, Agent, or Firm* — IP & T Group LLP

(57) ABSTRACT

A resistive memory device includes: a memory cell comprising first and second electrodes and a resistive layer formed therebetween, wherein the resistive layer is formed of a resistance change material; and a strained film formed adjacent to the resistive layer and configured to apply a strain to the resistive layer.

31 Claims, 6 Drawing Sheets

US 9,166,162 B2

RESISTIVE MEMORY DEVICE

CROSS-REFERENCE TO RELATED APPLICATIONS

The present application claims priority of Korean Patent Application No. 10-2012-0050242, filed on May 11, 2012, which is incorporated herein by reference in its entirety.

BACKGROUND

1. Field

Exemplary embodiments of the present invention relate to a resistive memory device, and more particularly, to a resistive memory device including a resistive layer having a resistance change characteristic for a memory layer.

2. Description of the Related Art

A nonvolatile memory device may include a magnetic random access memory (MRAM), a ferroelectric random access memory (FeRAM), a phase-change random access memory (PCRAM), a resistance random access memory (ReRAM) and the like. Here, the ReRAM (i.e., a resistive memory device) stores data corresponding to '1' or '0', using a resistance change characteristic. When a voltage equal to or more than a set voltage is applied to a resistance change material, the resistance of the resistance change material decreases. This state may be referred to as an ON state. Furthermore, when a voltage equal to or more than a reset voltage is applied to the resistance change material, the resistance of the resistance change material increases. This state may be referred to as an OFF state.

Thus, a resistive memory device has a characteristic of switching to the low-resistance state or the high-resistance state. Here, a method for improving the switching characteristic is useful.

SUMMARY

An embodiment of the present invention is directed to a resistive memory device capable of reducing an operation voltage while maintaining or improving a switching characteristic in a resistance state.

In accordance with an embodiment of the present invention, a resistive memory device includes: a memory cell comprising first and second electrodes and a resistive layer formed therebetween, wherein the resistive layer is formed of a resistance change material; and a strained film formed adjacent to the resistive layer and configured to apply a strain to the resistive layer.

In accordance with another embodiment of the present invention, a resistive memory device includes: a plurality of first conductive lines arranged in parallel to each other; a plurality of second conductive lines crossing the first conductive lines and arranged in parallel to each other; and a plurality of memory cells formed at each intersection between the first and second conductive lines. The memory cells each include first and second electrodes and a resistive layer formed between the first and second electrodes and the resistive layer includes a resistance change material, and the resistive memory device further includes a strained film formed adjacent to the resistive layer and configured to apply a strain to the resistive layer.

DETAILED DESCRIPTION

Figure 1A:
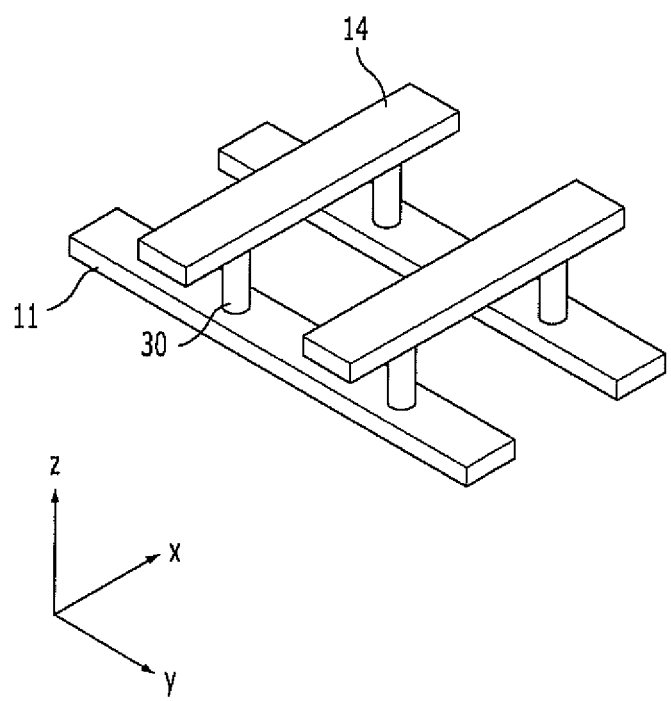
FIG. 1A is a perspective view of a resistive memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
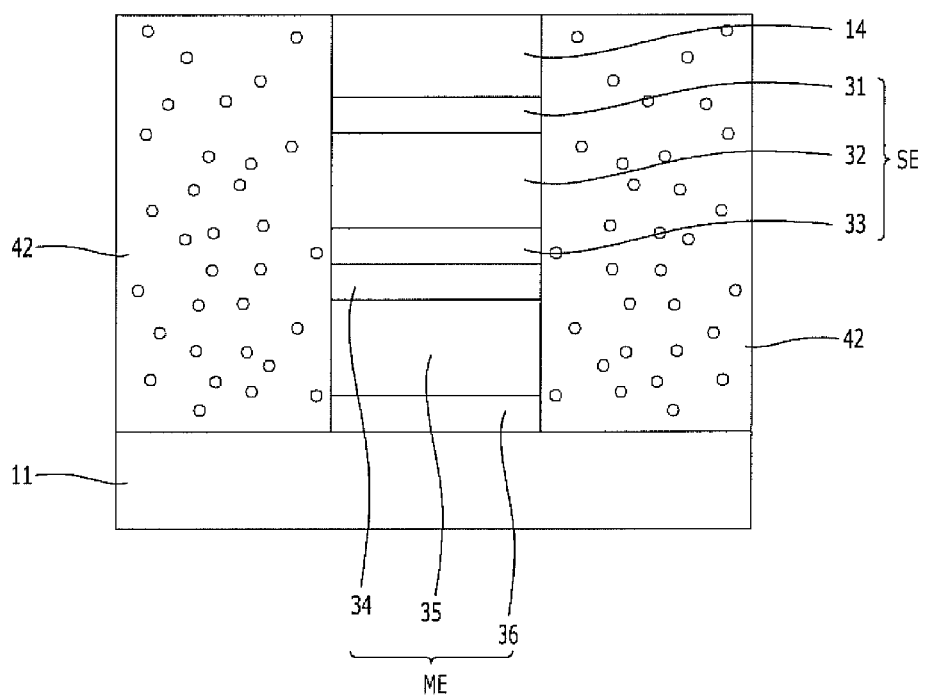
FIG. 1B is a cross-sectional view of any one cell of the resistive memory device of FIG. 1A, taken along the Z axis.

FIG. 1A is a perspective view of a resistive memory device in accordance with an embodiment of the present invention. FIG. 1B is a cross-sectional view of any one cell of the resistive memory device of FIG. 1A, taken along the Z axis.

FIGS. 1A and 1B illustrate a memory cell array having a crossbar structure. The crossbar structure includes a plurality of first conductive lines formed in parallel to each other, a plurality of second conductive lines crossing the first conductive lines and formed in parallel to each other, and a plurality of resistance elements formed at the respective intersections between the first and second conductive lines. The crossbar structure facilitates a high integration of the memory cell array.

Referring to FIG. 1A, a first conductive line 11 is formed over a substrate (not illustrated) having a desired lower structure formed therein. Here, the first conductive line 11 may be formed of a metal such as Al, W, or Cu. For example, a plurality of first conductive lines may be formed in parallel to each other in the Y-axis direction. Over the first conductive line 11, a second conductive line 14 may be formed in a direction crossing the first conductive line 11, that is, in the X-axis direction, while spaced at a desired distance from the first conductive line 11. Here, the second conductive line 14 may be formed of a metal such as Al, W, or Cu. For example, a plurality of second conductive lines may be formed in parallel to each other. Furthermore, memory cells 30 may be formed at the respective intersections/junctions between the first and second conductive lines 11 and 14.

Referring to FIG. 1B, the memory cell 30 may include a memory element ME and a switching element SE. The memory element ME may include a first electrode 36, a resistive layer 35, and a second electrode 34, which are stacked over the first conductive line 11. The switching element SE is an element for accessing a specific cell within the memory cell array and serves to control a signal access. The switching element SE may have a stacked structure of a lower electrode 33, a switching layer 32, and an upper electrode 31. In this embodiment of the present invention, the switching element SE may be omitted. Furthermore, although the switching element SE is shown to be positioned over the memory element ME, the switching element SE may be positioned under the memory element ME. The memory cell 30 may be any reasonably suitable memory cell for storing data.

The resistive layer 35 of the memory element ME has a tensile or compressive strain. That is, the resistive layer 35 may include a tensile strained resistive layer or a compressive strained resistive layer.

Here, a switching operation of the resistive layer 35 (that is, a resistance state change) is performed by movement of oxygen ions or oxygen vacancies. Therefore, when a strain is applied to the resistive layer 35, the mobility of oxygen ions (or oxygen vacancies) within the resistive layer may be improved. More specifically, when major carriers of the resistive layer material are oxygen ions, the memory element ME is configured to have a tensile strained resistive layer. On the other hand, when the major carriers of the resistive layer material are oxygen vacancies, the memory element ME is configured to have a compressive strained resistive layer. The strained resistive layer may improve the carrier mobility. When the carrier mobility is improved, a larger amount of current may be passed at the same voltage. Therefore, set and reset voltages for supplying a current in the switching operation may be decreased.

Referring to FIG. 1B, the resistive layer 35 of the memory element ME is surrounded by an insulation layer 42 having a strain. The insulation layer 42 may include a single layer or multiple layers. The insulation layer 42 is not illustrated in FIG. 1A.

In this embodiment of the present invention, the insulation layer 42 has a complementary strain to the strain of the resistive layer 35. The insulation layer 42 is formed adjacent to the resistive layer 35. Therefore, when a strain is applied to the insulation layer 42, the resistive layer 35 has an opposite strain to the insulation layer 42. More specifically, when the resistive layer 35 is formed of a tensile strained resistive layer, the insulation layer 42 surrounding the resistive layer 35 may be formed to have a compressive strain. Furthermore, when the resistive layer 35 is formed of a compressive strained resistive layer, the insulation layer 42 surrounding the resistive layer 35 may be formed to have a tensile strain.

In this embodiment of the present invention, the resistive layer 35 may be formed of a metal oxide. For example, the metal oxide may include one or more of a Ta oxide, Zr oxide, yttria-stabilized zirconia (YSZ), Ti oxide, Hf oxide, Mn oxide, Mg oxide, and alloys thereof. Furthermore, the resistive layer 35 may have a stacked structure of layers of homogeneous or heterogeneous metal oxides.

The insulation layer 42 having a strain may be formed of various materials. Furthermore, the insulation layer 42 may include a single layer or multiple layers. For example, the insulation layer 42 may be formed of an oxide or a nitride. More specifically, the insulation layer 42 may be formed of a silicon oxide or a silicon nitride. The insulation layer 42 may be any reasonably suitable insulation layer that has a compressive (or tensile) strain so as to apply a tensile (or compressive) strain to the resistive layer 35. The insulation layer 42 having a strain may be formed by any reasonable method such as the ones described below.

Figure 2:
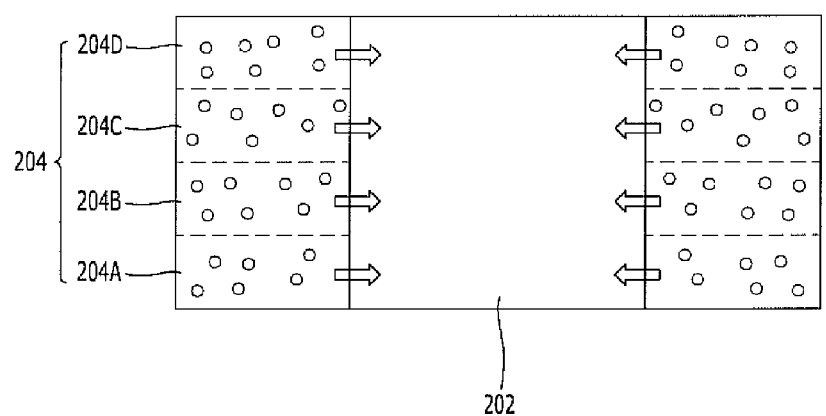
FIGS. 2 to 5 are cross-sectional views illustrating materials and structures of various insulation layers for applying a strain to a resistive layer.
Figure 3:
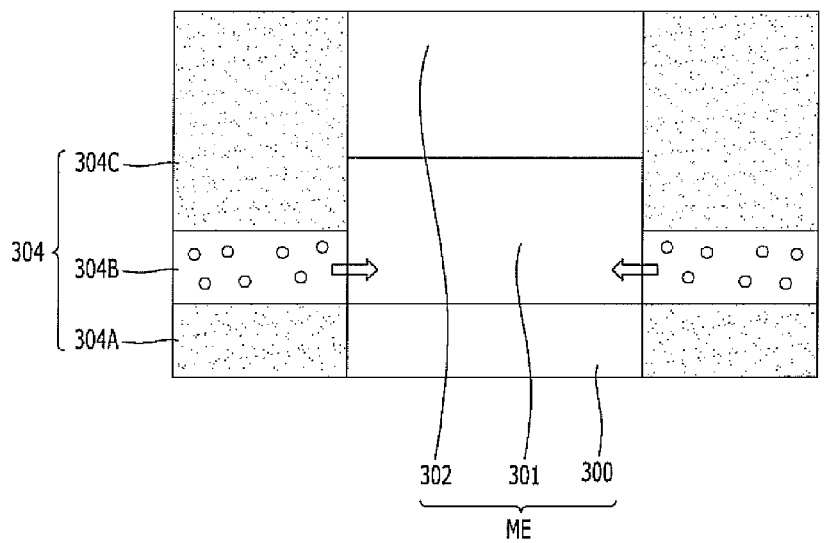

FIGS. 2 and 3 are cross-sectional views illustrating materials and structures of various insulation layers for applying a strain to the resistive layer.

FIGS. 2 and 3 illustrate a method that oxidizes and/or nitrifies a thin film deposited for an insulation layer such that the insulation layer has a strain.

Specifically, referring to FIG. 2, an insulation layer 204 is provided to surround a resistive layer 202. The insulation layer 204 may include a silicon oxide or silicon nitride obtained by oxidizing or nitrifying a silicon thin film after deposition of the silicon thin film.

At this time, when the insulation layer 204 is to be thick, it is difficult to oxidize the silicon thin film at one time after the deposition of the silicon thin film. Therefore, a plurality of cycles of deposition and oxidization (or nitrification) may be performed to form the insulation layer 204 including multiple layers 204A to 204D.

Furthermore, the insulation layer 204 may include an insulation layer based on SiGe or GaAs. Furthermore, the insulation layer 204 may include an insulation layer formed by depositing a specific thin film, implanting oxygen ions or nitrogen ions into the thin film, and oxidizing or nitrifying the thin film.

In this embodiment of the present invention, the insulation layer 204 having a strain may be formed as the entire interlayer dielectric layer. According to an example, a typical dielectric material may be used as an interlayer dielectric layer, and the insulation layer 204 may be formed by forming a hole around a patterned memory cell (or around a resistor) and burying a material having a strain in the hole.

Referring to FIG. 3, an insulation layer 304 is provided to surround the memory element ME. The memory element ME may include a first electrode 300, a resistive layer 301, and a second electrode 302, which are stacked. The insulation layer 304 has a stacked structure of a first insulation layer 304A, a second insulation layer 302B, and a third insulation layer 302C. At this time, the second insulation layer 304B adjacent to the resistive layer 302 has a tensile strain. The second insulation layer 304B may be formed of a silicon oxide (or silicon nitride) obtained by depositing and oxidizing (or nitrifying) a thin film. The first and third insulation layers 304A and 304C may be formed of a dielectric layer having no strain and formed by a typical chemical vapor deposition (CVD) process. Here, the second insulation layer 304B having a strain may be formed of a dielectric layer based on SiGe and GaAs. Furthermore, the second insulation layer 304B may include an insulation layer formed by depositing a specific thin film, implanting oxygen ions or nitrogen ions into the thin film, and oxidizing or nitrifying the ion-implanted thin film.

Figure 4:
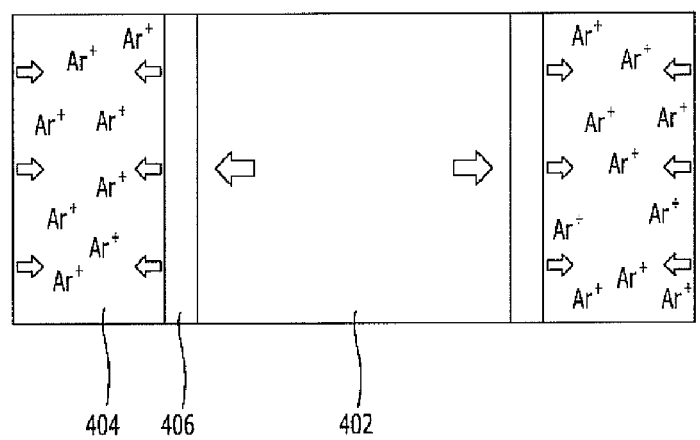
Figure 5:
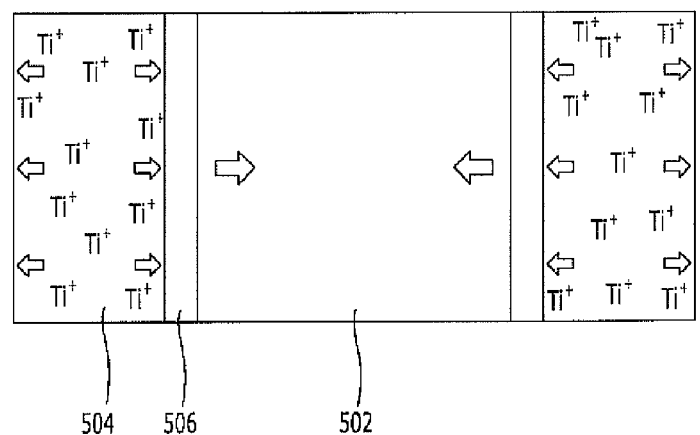

FIGS. 4 and 5 illustrate a case in which a strain is applied to a resistive layer by a thin film other than an insulation layer.

Referring to FIG. 4, a thin film 404 having a compressive strain (hereafter, referred to as "a strained thin film") is provided adjacent to a resistive layer 402. The strained thin film 404 has a compressive strain, as ions are implanted into the strained thin film 404. An insulation layer 406 may be formed between the resistive layer 402 and the strained thin film 404. The strained thin film 404 may be formed by implanting ions such as Ar+ into a crystalline thin film such as silicon, for example. In this case, since the strained thin film 404 receives a compressive strain, a tensile stress is applied to the resistive layer 402 surrounded by the strained thin film 404. The insulation layer 406 serves to insulate the resistive layer 402 and may be formed of an oxide or a nitride having an excellent insulation characteristic. When the insulation layer 406 is thick, the strain of the stained thin film 404 is not effectively transmitted to the resistive layer 402. Therefore, the insulation layer 406 may be designed to have a small thickness while maintaining insulation.

Referring to FIG. 5, a strained thin film 504 having a tensile strain is provided adjacent to a resistive layer 502. The strained thin film 504 has a tensile strain as ions are implanted into the stained thin film 504. An insulation layer 506 is interposed between the resistive layer 502 and the strained thin film 504. The strained thin film 504 may be formed by implanting ions such as Ti+ into a crystalline thin film such as silicon, for example. Since the strained thin film 504 has a tensile strain, the resistive layer 502 has a compressive strain. The insulation layer 506 serves to insulate the resistive layer 502, and may be formed of an oxide or a nitride having an excellent insulation characteristic. When the insulation layer 506 is thick, the strain of the stained thin film 504 is not effectively transmitted to the resistive layer 502. Therefore, the insulation layer 506 may be designed to have a small thickness while maintaining insulation.

Figure 6:
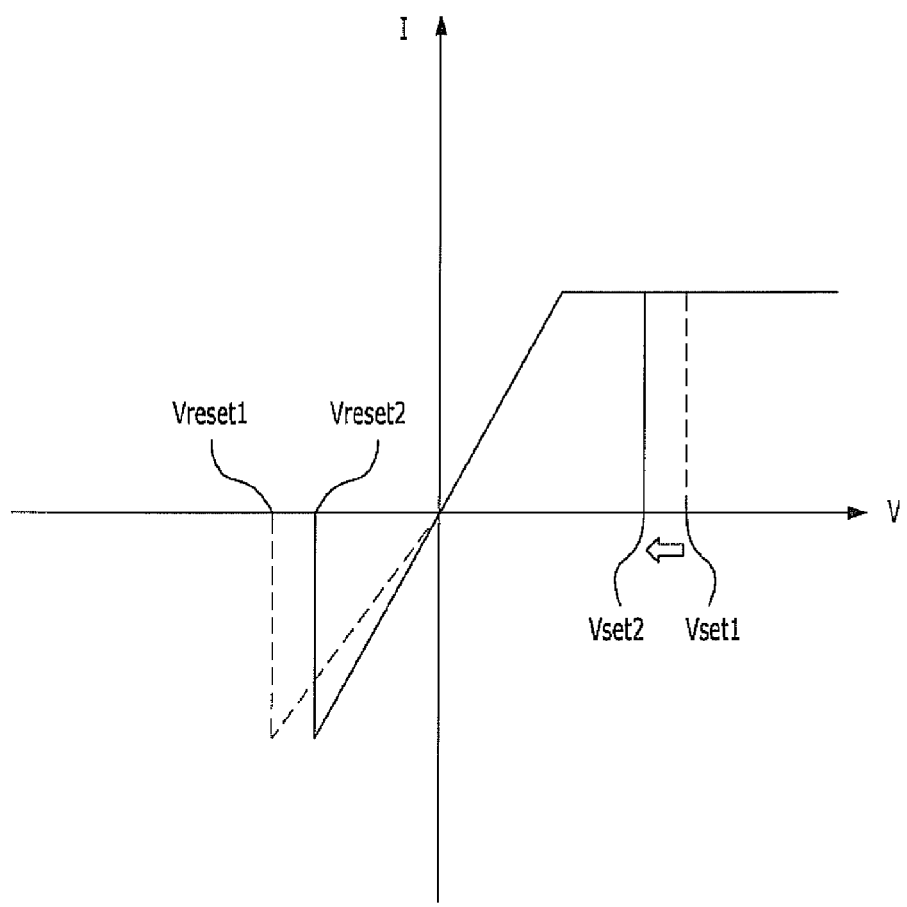
FIG. 6 is a current-voltage graph showing a switching characteristic of a memory element in accordance with the embodiment of the present invention.

FIG. 6 is a current-voltage graph showing the switching characteristic of the memory element in accordance with the embodiment of the present invention. Here, a case in which the embodiment of the present invention is applied to a bipolar ReRAM was taken as an example, for illustration purposes. However, the embodiment of the present invention may also be applied to a unipolar ReRAM. FIG. 6 shows that a set state occurs at a positive (+) bias and a reset state occurs at a negative (−) bias. Depending on ReRAM fabrication methods, the biases and switching directions for the set and reset states occur may be reversed with respect to each other.

In a conventional ReRAM, a switching characteristic of the ReRAM may be varied by changing a resistive layer material or electrode. However, when the resistive layer material or electrode is changed, other switching characteristics such as operation voltage, operation current, switching pass rate, and on/off ratio may be degraded.

In this embodiment of the present invention, the interlayer dielectric layer formed adjacent to the resistive layer is formed to have a strain. Therefore, as a complementary strain to the strain of the interlayer dielectric layer is applied to the resistive layer, the carrier mobility within the resistive layer may be improved. Accordingly, a set voltage Vset2 and a reset voltage Vreset2 in accordance with the embodiment of the present invention are reduced more than a set voltage Vset1 and a reset voltage Vreset1 in the conventional ReRAM.

Figure 7:
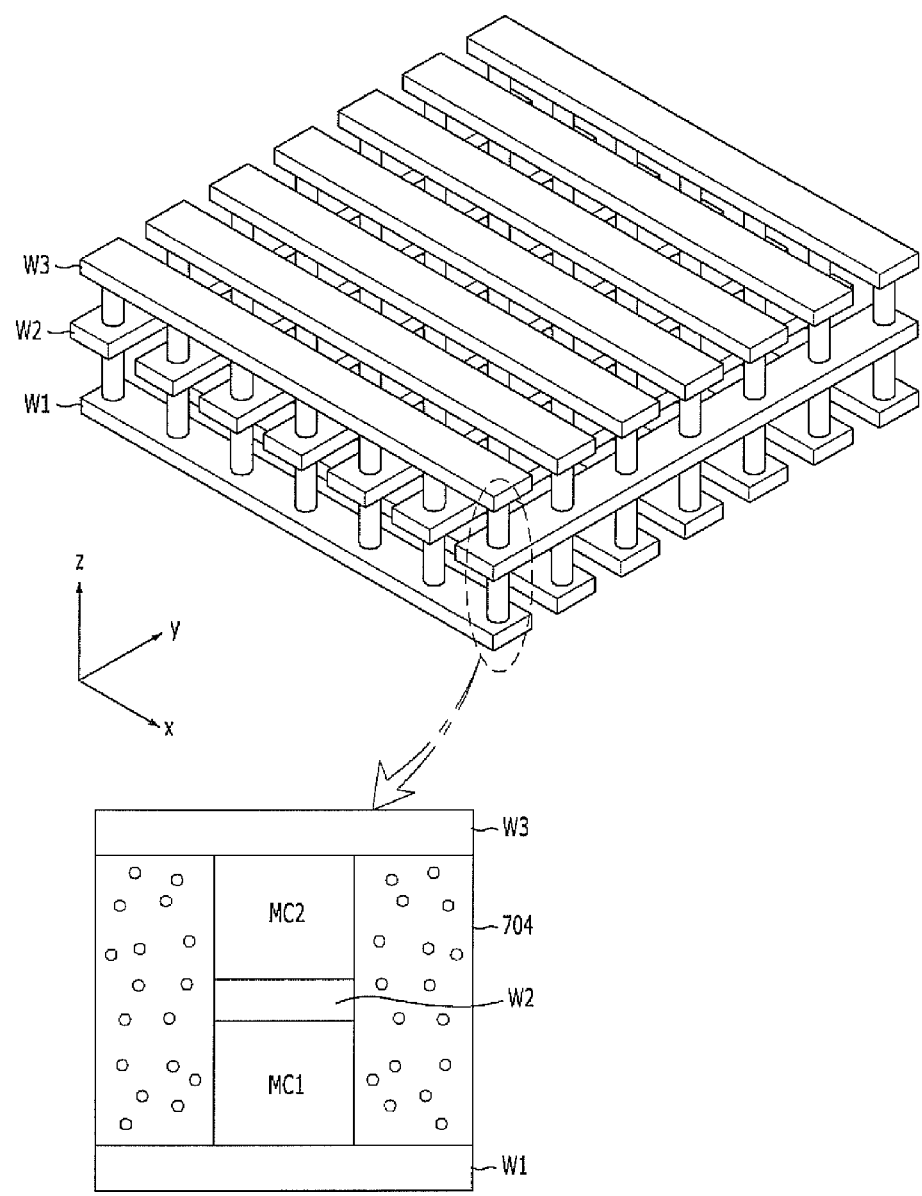
FIG. 7 illustrates that a resistive memory device having the memory elements in accordance with the embodiment of the present invention is three-dimensionally integrated.

FIG. 7 illustrates that a resistive memory device having the memory elements in accordance with the embodiment of the present invention is three-dimensionally integrated.

Referring to FIG. 7, a plurality of first conductive lines W1 are formed in parallel to each other in the X-axis direction, and a plurality of second conductive lines W2 are formed in parallel to each other in the Y-axis direction. The second conductive lines W2 are spaced at a desired distance from the first conductive lines W1 along the Z axis. At the respective intersection between the first and second conductive lines W1 and W2, a plurality of first memory cells MC1 are formed between the first and second conductive lines W1 and W2. Furthermore, a plurality of third conductive lines W3 are formed over the second conductive lines W2 so as to be spaced at a desired distance from the second conductive lines W2 along the Z axis. The third conductive lines W3 are formed in parallel to each other in the X-axis direction. At the respective intersection between the second and third conductive lines W2 and W3, a plurality of memory cells MC2 are formed between the second and third conductive lines W2 and W3. The surroundings of the patterns, the conductive lines, and the memory cells may be filled with a stained thin film 704. At this time, the strained thin film 704 may be used as an interlayer dielectric layer.

Here, each of the first and second memory cells MC1 and MC2 may include a memory element and a switching element. The memory element includes a resistive layer. The resistive layer may have a strain. Accordingly, the carrier mobility of the resistive layer is improved. Applying a strain to the resistive layer may be accomplished by forming the strained thin film 704 adjacent to the resistive layer. According to another example, unlike the configuration of FIG. 7, the strained thin film may be arranged only in a part of the space between the conductive lines so as to apply a strain, for example, only to the resistive layer.

While the present invention has been described with respect to the specific embodiments, it will be apparent to those skilled in the art that various changes and modifications may be made without departing from the spirit and scope of the invention as defined in the following claims.

What is claimed is:

1. A resistive memory device comprising:
a memory cell comprising first and second electrodes and a resistive layer formed therebetween, wherein the resistive layer is formed of a resistance change material of which a switching operation is performed by movement of oxygen ions or oxygen vacancies; and
a strained film formed adjacent to the resistive layer and configured to apply a strain to the resistive layer and increase a mobility of the oxygen ions or the oxygen vacancies.

2. The resistive memory device of claim 1, wherein the strained film has a compressive strain and the resistive layer has a tensile strain.

3. The resistive memory device of claim 1, wherein the strained film has a tensile strain and the resistive layer has a compressive strain.

4. The resistive memory device of claim 1, further comprising an insulation layer interposed between the strained film and the resistive layer.

5. The resistive memory device of claim 4, wherein the strained film comprises a silicon film having Ar+ ions and the insulation layer comprises an oxide or a nitride.

6. The resistive memory device of claim 4, wherein the strained film comprises a silicon film having Ti+ ions and the insulation layer comprises an oxide or a nitride.

7. The resistive memory device of claim 1, wherein the strained film comprises a silicon oxide.

8. The resistive memory device of claim 7, wherein the silicon oxide has a stacked structure including multiple silicon oxide layers.

9. The resistive memory device of claim 1, wherein the strained film comprises silicon nitride.

10. The resistive memory device of claim 9, wherein the silicon nitride has a stacked structure including multiple silicon nitride layers.

11. The resistive memory device of claim 1, wherein the memory cell further comprises a switching element disposed under the first electrode or over the second electrode.

12. A resistive memory device comprising:
a plurality of first conductive lines arranged in parallel to each other;
a plurality of second conductive lines crossing the first conductive lines and arranged in parallel to each other; and
a plurality of memory cells formed at each intersections between the first and second conductive lines,
wherein each of the memory cells comprises first and second electrodes and a resistive layer formed between the first and second electrodes and the resistive layer includes a resistance change material of which a switching operation is performed by movement of oxygen ions or oxygen vacancies, and the resistive memory device further comprises a strained film formed adjacent to the resistive layer and configured to apply a strain to the resistive layer and increase a mobility of the oxygen ions or the oxygen vacancies.

13. The resistive memory device of claim 12, wherein the strained film has a compressive strain and the resistive layer has a tensile strain.

14. The resistive memory device of claim 12, wherein the strained film has a tensile strain and the resistive layer has a compressive strain.

15. The resistive memory device of claim 12, further comprising an insulation layer interposed between the strained film and the resistive layer.

16. The resistive memory device of claim 15, wherein the strained film comprises a silicon film having Ar+ ions and the insulation layer comprises an oxide or a nitride.

17. The resistive memory device of claim 15, wherein the strained film comprises a silicon film having Ti+ ions and the insulation layer comprises an oxide or a nitride.

18. The resistive memory device of claim 12, wherein the strained film comprises a silicon oxide.

19. The resistive memory device of claim 18, wherein the silicon oxide has a stacked structure including multiple silicon oxide layers.

20. The resistive memory device of claim 12, wherein the strained film comprises a silicon nitride.

21. The resistive memory device of claim 20, wherein the silicon nitride has a stacked structure including multiple silicon nitride layers.

22. The resistive memory device of claim 12, wherein the memory cell further comprises a switching element disposed under the first electrode or over the second electrode.

23. The resistive memory device of claim 12, wherein the resistive memory device further comprises: a plurality of third conductive lines formed over the second conductive lines so as to cross the second conductive lines; and a second memory cell formed at each junction between the second and third conductive lines.

24. The resistive memory device of claim 23, wherein the second memory cell comprises a second resistive layer having a resistance change material, and the resistive memory device further comprises a second strained film formed adjacent to the second resistive layer and configured to apply a strain to the second resistive layer.

25. A resistive memory device comprising:
a memory cell comprising first and second electrodes and a resistive layer formed therebetween, wherein the resistive layer is formed of a resistance change material;
a strained film formed adjacent to the resistive layer and configured to apply a strain to the resistive layer; and
an insulation layer interposed between the strained film and the resistive layer.

26. The resistive memory device of claim 25, wherein the strained film comprises a silicon film having Ar+ ions and the insulation layer comprises an oxide or a nitride.

27. The resistive memory device of claim 25, wherein the strained film comprises a silicon film having Ti+ ions and the insulation layer comprises an oxide or a nitride.

28. A resistive memory device comprising:
a memory cell comprising first and second electrodes and a resistive layer formed therebetween, wherein the resistive layer is formed of a resistance change material; and
a strained film formed adjacent to the resistive layer and configured to apply a strain to the resistive layer, wherein the strained film comprises a silicon oxide.

29. The resistive memory device of claim 28, wherein the silicon oxide has a stacked structure including multiple silicon oxide layers.

30. A resistive memory device comprising:
a memory cell comprising first and second electrodes and a resistive layer formed therebetween, wherein the resistive layer is formed of a resistance change material; and
a strained film formed adjacent to the resistive layer and configured to apply a strain to the resistive layer, wherein the strained film comprises silicon nitride.

31. The resistive memory device of claim 30, wherein the silicon nitride has a stacked structure including multiple silicon nitride layers.

* * * * *